(12) United States Patent
Tanzawa

(10) Patent No.: US 7,902,907 B2
(45) Date of Patent: Mar. 8, 2011

(54) COMPENSATION CAPACITOR NETWORK FOR DIVIDED DIFFUSED RESISTORS FOR A VOLTAGE DIVIDER

(75) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 193 days.

(21) Appl. No.: 11/954,763

(22) Filed: Dec. 12, 2007

(65) Prior Publication Data
US 2009/0153237 A1 Jun. 18, 2009

(51) Int. Cl.
*G05F 1/10* (2006.01)
(52) U.S. Cl. .......................................... 327/536; 327/530
(58) Field of Classification Search .................. None
See application file for complete search history.

(56) References Cited

U.S. PATENT DOCUMENTS

| | | | | |
|---|---|---|---|---|
| 4,847,518 A * | 7/1989 | Leidich | ............ | 327/541 |
| 5,111,068 A * | 5/1992 | Kusakabe | ............ | 327/565 |
| 5,796,296 A * | 8/1998 | Krzentz | ............ | 327/545 |
| 5,844,404 A * | 12/1998 | Caser et al. | ............ | 323/314 |
| 5,883,508 A * | 3/1999 | Ermisch et al. | ............ | 323/359 |
| 6,018,272 A * | 1/2000 | Marsh et al. | ............ | 330/307 |
| 6,100,750 A * | 8/2000 | Van Der Zee | ............ | 327/531 |
| 6,104,277 A * | 8/2000 | Iniewski et al. | ............ | 338/311 |
| 6,177,665 B1 * | 1/2001 | Wolf | ............ | 250/207 |
| 6,188,473 B1 * | 2/2001 | Leistner et al. | ............ | 356/213 |
| 6,229,379 B1 * | 5/2001 | Okamoto | ............ | 327/535 |
| 6,259,612 B1 * | 7/2001 | Itoh | ............ | 363/60 |
| 6,856,123 B2 * | 2/2005 | Takabayashi | ............ | 323/273 |
| 6,861,895 B1 * | 3/2005 | Liu et al. | ............ | 327/536 |
| 6,891,764 B2 * | 5/2005 | Li | ............ | 365/189.15 |
| 6,963,298 B2 * | 11/2005 | Otsuka et al. | ............ | 341/155 |
| 7,453,305 B2 * | 11/2008 | Moane et al. | ............ | 327/307 |
| 7,554,311 B2 * | 6/2009 | Pan | ............ | 323/285 |
| 2005/0030771 A1 * | 2/2005 | Conte et al. | ............ | 363/59 |

OTHER PUBLICATIONS

Tanzawa, et al.; Wordline Voltage Generating System for Low-Power Low-Voltage Flash Memories; IEEE (Institute of Electrical and Electronics Engineers) Journal of Solid-State Circuits; Jan. 2001; pp. 55-63; vol. 36, No. 1; IEEE (Institute of Electrical and Electronics Engineers).

Byeon, et al.; An 8Gb Multi-Level NAND Flash Memory with 63nm STI CMOS Process Technology; 2005 IEEE (Institute of Electrical and Electronics Engineers) International Solid-State Circuits Conference, Digest of Technical Papers; Feb. 7, 2005; pp. 46-47, IEEE (Institute of Electrical and Electronics Engineers).

Campardo, et al.; 40-mm² 3-V-Only 50-MHz 64-Mb 2-b/cell CHE NOR Flash Memory; IEEE (Institute of Electrical and Electronics Engineers) Journal of Solid-State Circuits; Nov. 2000; pp. 1655-1667; Vo. 35, No. 11, IEEE (Institute of Electrical and Electronics Engineers).

* cited by examiner

*Primary Examiner* — Thomas J Hiltunen
(74) *Attorney, Agent, or Firm* — Knobbe Martens Olson & Bear LLP

(57) ABSTRACT

A voltage divider of a voltage regulator system is disclosed utilizing divided diffused resistors. In one embodiment, a feed-forward capacitor network is connected across the resistors and the voltage divider output. The feed-forward capacitor network allows the output to rise and fall quickly with a change in the voltage divider input. Accordingly, an improved frequency response should be obtained utilizing divided diffused resistors.

19 Claims, 14 Drawing Sheets

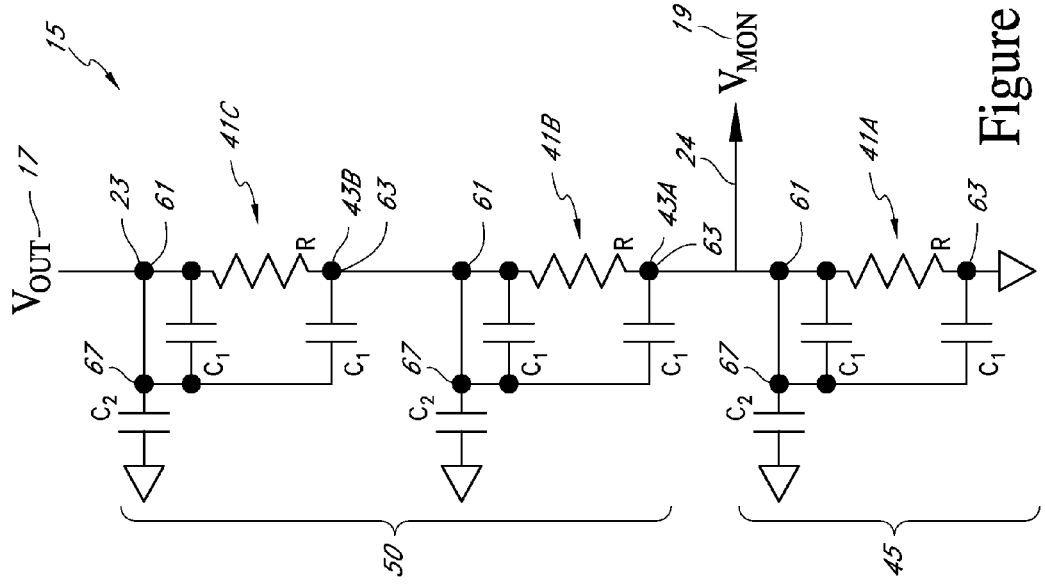
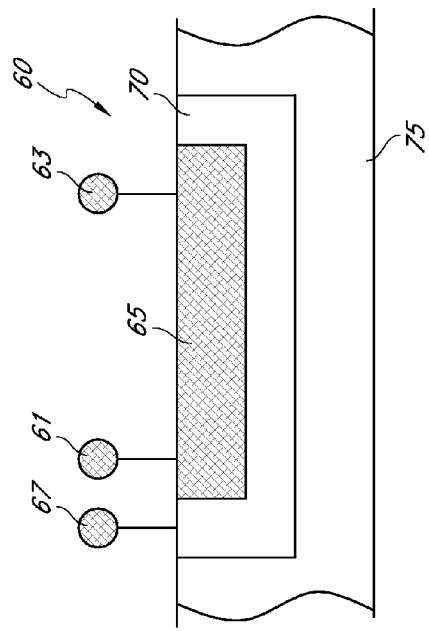
Figure 3A
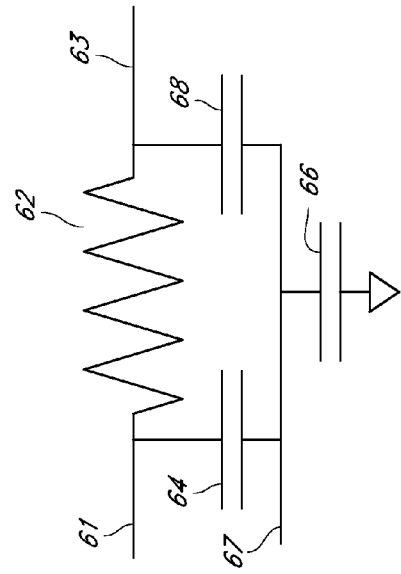
Figure 3B
Figure 3C

COMPENSATION CAPACITOR NETWORK FOR DIVIDED DIFFUSED RESISTORS FOR A VOLTAGE DIVIDER

BACKGROUND OF THE INVENTION

1. Field of the Invention

Embodiments of the invention relate to electronics, and in particular, embodiments relate to a voltage divider having a compensation capacitor network.

2. Description of the Related Art

Many semiconductor devices such, as flash memories utilize voltage regulator circuits with charge pumps to obtain relatively high voltage levels that are higher than a supply voltage available to the semiconductor devices. In flash memories, these relatively high voltages are used to erase data. A voltage divider is utilized to monitor an output voltage of the voltage regulator. This monitored voltage is utilized along with a reference voltage to control the output voltage of the regulator system.

To handle relatively high voltages, multiple resistors for a voltage divider can be connected in series. However, as the number of series-connected resistors increases, the frequency response of the voltage divider can degrade and electrical performance can suffer.

BRIEF DESCRIPTION OF THE DRAWINGS

FIG. 3A is a cross-sectional diagram of a p-diffused resistor in an n-well;

FIG. 3B is an equivalent circuit diagram of a p-diffused resistor in an n-well;

FIG. 3C is an equivalent circuit diagram of a voltage divider implemented with p-diffused resistors in divided n-wells;

DETAILED DESCRIPTION OF THE EMBODIMENTS

Various embodiments according to the invention will be described hereinafter with reference to the accompanying drawings. These embodiments are illustrated and described for example only, and they are not intended to limit the scope of the invention. While illustrated in the context of a charge-pump type of voltage regulator, the skilled artisan will appreciate that the principles and advantages described herein are applicable to other circuits, such as, but not limited to, linear voltage regulators.

Figure 1:
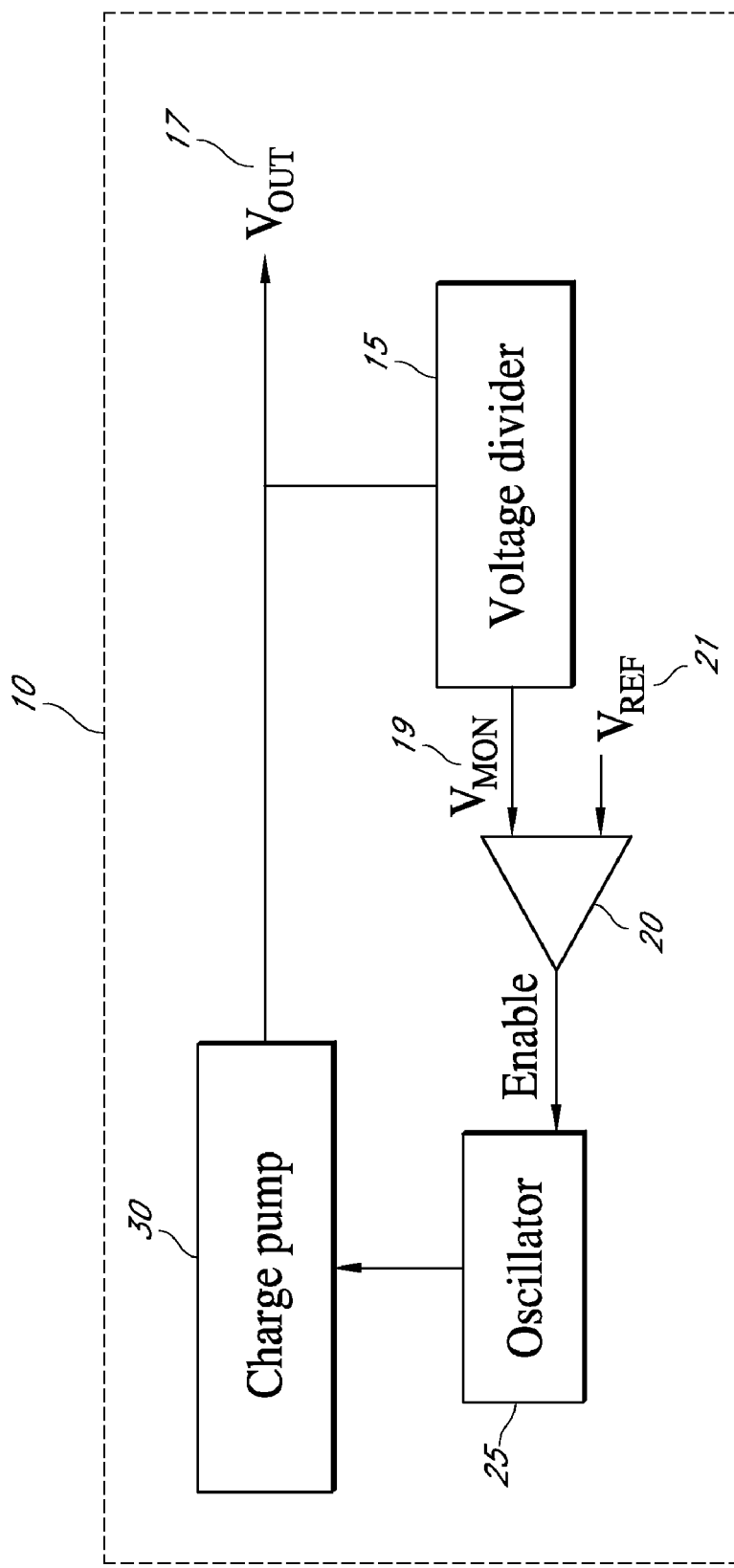
FIG. 1 is a block diagram showing a voltage regulator.

A voltage regulator system can be used, for example, to provide a voltage level greater than a supplied voltage. In some industrial applications, a voltage regulator system may be utilized in order to provide a stable voltage where the voltage supply may otherwise have a high amount of noise. A block diagram of one embodiment of a voltage regulator system 10 is shown in FIG. 1. The illustrated voltage regulator system 10 includes a voltage divider 15, a comparator 20, an oscillator 25, and a charge pump 30 coupled in a feedback loop.

An output voltage $V_{OUT}$ 17 of the voltage regulator system is monitored by the voltage divider 15. The voltage divider 15 receives the output voltage $V_{OUT}$ 17 as an input and generates a monitored voltage $V_{MON}$ 19, which is a fraction of the output voltage $V_{OUT}$ 17.

The monitored voltage $V_{MON}$ 19 is provided as an input, along with a reference voltage $V_{REF}$ 21, to the comparator 20. The comparator 20 compares the monitored voltage $V_{MON}$ 19 with the reference voltage $V_{REF}$ 21. When the magnitude of the monitored voltage $V_{MON}$ 19 is less than the magnitude of the reference voltage $V_{REF}$ 21, the comparator 20 generates a control signal that enables the function of the oscillator 25 in order to activate the clock signal. In this case, the charge pump 30 receives the clock signal from the oscillator 25, and the charge pump 30 is activated to increase the voltage level of the output voltage $V_{OUT}$ 17. When the monitored voltage $V_{MON}$ 19 has a greater magnitude than the reference voltage $V_{REF}$ 21, the comparator 20 generates a control signal that disables, the function of the oscillator 25. In one embodiment, when disabled, the oscillator 25 disables the clock signal, e.g., stops or slows down the transitioning of the clock signal. The clock signal is provided as an input to the charge pump 30. The output voltage $V_{OUT}$ 17 of the charge pump 30 decreases in magnitude when the clock signal is disabled.

The reference voltage $V_{REF}$ 21 can be adjusted to control the voltage used to erase a block of memory of a flash memory device. If the reference voltage $V_{REF}$ 21 is increased, the monitored voltage $V_{MON}$ 19 will temporarily be less than the reference voltage $V_{REF}$ 21. The state of the output signal of the comparator 20 enables the oscillator 25. In that case, the charge pump 30 will be activated by the clock signal of the oscillator 25 and the output voltage $V_{OUT}$ 17 should increase to at least the desired level. The monitored voltage $V_{MON}$ 19 should be proportional to the output voltage $V_{OUT}$ 17, so that an increase in the output voltage $V_{OUT}$ 17 should lead to a corresponding proportional (fractional) increase in the monitored voltage $V_{MON}$ 19.

By contrast, after operating at a relatively high voltage for some time, the reference voltage $V_{REF}$ 21 can be decreased, and the monitored voltage $V_{MON}$ 19 will be higher than the reference voltage $V_{REF}$ 21. Charge pump 30 will then be deactivated. This will cause the output voltage $V_{OUT}$ 17 to decrease, and the monitored voltage $V_{MON}$ 19 with it, until the monitored voltage $V_{MON}$ 19 once again approximates the reference voltage $V_{REF}$ 21.

To function efficiently, it is desired that the voltage divider 15 be relatively accurate across a wide range of voltages and have a desirable frequency response. This may allow for decreased delay, increased signal speeds, and fewer errors in some integrated circuit devices.

Figure 2:
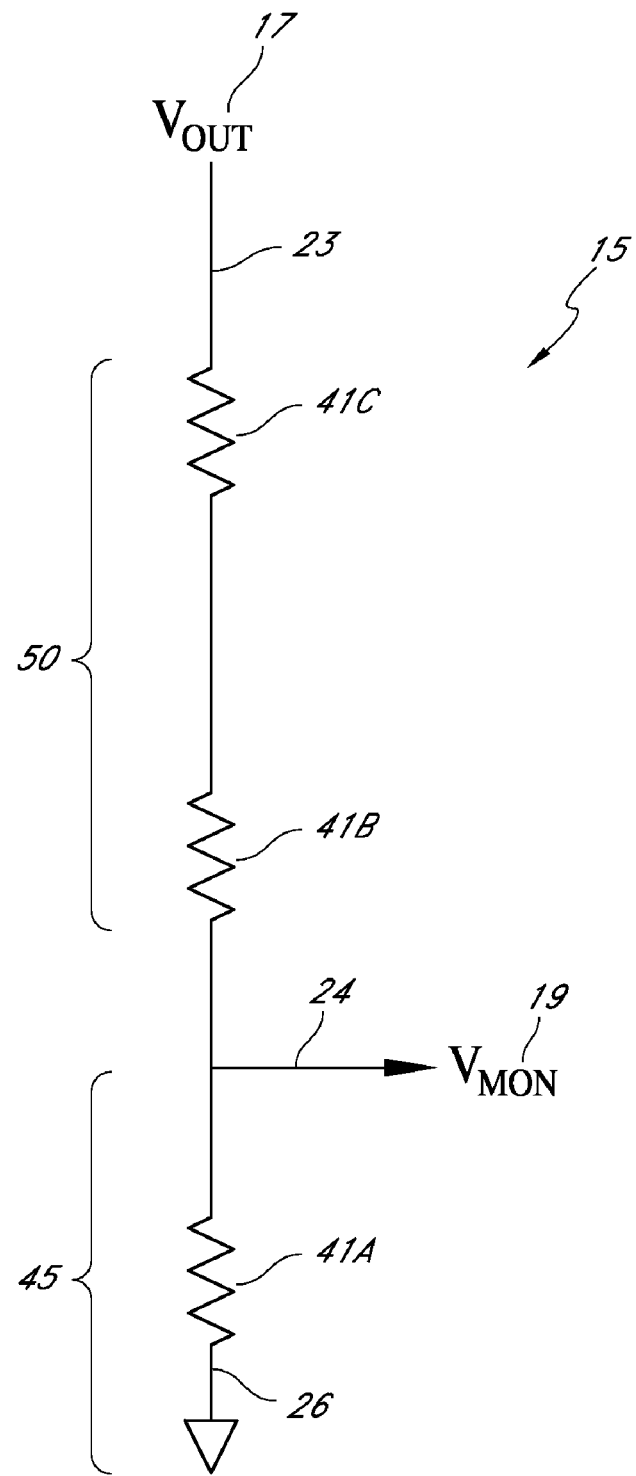
FIG. 2 is a circuit diagram showing a voltage divider.

FIG. 2 is an example of a voltage divider 15. The voltage divider 15 can be used in a voltage regulator system 10. The voltage divider 15 includes a first input terminal 23 connected to the output voltage $V_{OUT}$ 17, a second output terminal 24 connected to the monitored voltage $V_{MON}$ 19, and a terminal 26 connected to a voltage reference, typically ground (0 V). The voltage reference for the voltage divider 15 is typically not the same as the reference voltage $V_{REF}$ 21 for the comparator 20 (FIG. 1). The voltage divider 15 illustrated in FIG. 2 is characterized by two series resistance legs 45, 50. Resistance leg 45 includes a resistor 41A, and resistance leg 50 is includes a series combination of two resistors 41B, 41C. Typical resistance values for resistors formed in integrated circuits can be between about 10Ω (ohms) and about 10 MΩ. In some embodiments, of course, a different number of resistors with varying values can be utilized.

According to the voltage divider 15 shown, the relationship between the output voltage $V_{OUT}$ 17 and the monitored voltage $V_{MON}$ 19 is expressed in Equation 1.

$$V_{MON} = V_{OUT} \frac{R_{41A}}{R_{41A} + R_{41B} + R_{41C}} \quad \text{(Eq. 1)}$$

In Equation 1, variables $R_{41A}$, $R_{41B}$, and $R_{41C}$ represent the resistance values (e.g., $R_{41A}=R_{41B}=R_{41C}=400$ kΩ) of the resistors 41A, 41B, 41C. At the steady state of the system, the monitored voltage $V_{MON}$ 19 equals the reference voltage $V_{REF}$ 21 so that the output voltage $V_{OUT}$ 17 is related to the reference voltage $V_{REF}$ 21 by the ratio $(R_{41A}+R_{41B}+R_{41C})/R_{41A}$:1. When the reference voltage $V_{REF}$ 21 is changed, it is desired that the monitored voltage $V_{MON}$ 19 correspondingly rise or fall relatively quickly to maintain the relationship with respect to the output voltage $V_{OUT}$ 17. In this situation, the comparison between the reference voltage $V_{REF}$ 21 and the monitored voltage $V_{MON}$ 19 will more accurately control the output of the voltage regulator system with relatively low delay.

The selection of a particular type of resistor for use in a voltage divider impacts performance in this regard. The types of resistors available in semiconductor devices include, for example, polysilicon resistors, n-well resistors, and diffused resistors. This disclosure pertains to diffused resistors. Diffused resistors can be formed n-type in p-wells or p-type in n-wells.

A polysilicon resistor is typically formed by fabricating the polysilicon material over a silicon substrate. Terminals are formed at both ends of the polysilicon resistive portion, and the resistance value of the polysilicon resistor is determined by the electrical properties of material used and the dimensions of the resistor. Polysilicon resistors have a relatively small voltage coefficient and a relatively high breakdown voltage. However, fabrication of polysilicon resistors typically uses an additional process step (in a standard semiconductor device fabrication process), thereby increasing the process cost.

An n-well resistor is formed by fabricating an n-well in a silicon substrate. Both ends of the n-well are used for the terminals of the resistor. N-well resistors have a relatively high breakdown voltage when impurity concentration is sufficiently low. No additional process steps are required, because the n-well fabrication step is typically already used for the formation of the bulk of pMOSFETs. However, n-well resistors typically have a large voltage coefficient.

A diffused resistor may be formed by fabricating a p-diffused layer in an n-well, the n-well formed in a silicon substrate. The formation of such a resistor is efficient, because a similar process is used to create pMOSFETs, where the p-diffused layer may be used for the source or drain terminal of the pMOSFET. When utilized as a resistor, both ends of the p-diffused layer are used for terminals of the resistor. A well contact for the n-well is also utilized.

A cross section of a p-diffused resistor in an n-well is shown in FIG. 3A. The p-diffused resistor 60 includes a p-diffused layer 65, an n-well 70 surrounding the resistor layer, and a p-type substrate 75. The diffused resistor 60 further comprises a first terminal 61 and a second terminal 63 on the ends of the p-diffused layer 65. An electrical contact 67 is shown for on the n-well 70. While p-diffused resistors are discussed herein, it will be apparent to one of ordinary skill in the art that the principles and advantages described herein are also applicable to n-diffused resistors.

A diffused resistor has a small voltage coefficient because the impurity concentration is high enough to reduce the parasitic source and drain capacitance. However, diffused resistors have a relatively low breakdown voltage. The junction breakdown voltage between the resistor and n-well may not be much higher than the supply voltage of a pmosfet. When the output voltage $V_{OUT}$ can be higher than the breakdown voltage between the resistor and the n-well, multiple n-wells are typically arranged in series (divided) to reduce the maximum voltage across each n-well. For example, if the highest voltage applied across the voltage divider is to be approximately 24 V and the breakdown voltage between the p-diffused portion and the n-well is approximately 8 V, then the voltage divider typically uses more than three n-wells designed such that the maximum voltage across any one of them is less than 8 V. FIGS. 3B and 3C will be described after FIGS. 4A and 4B.

Figure 4B:
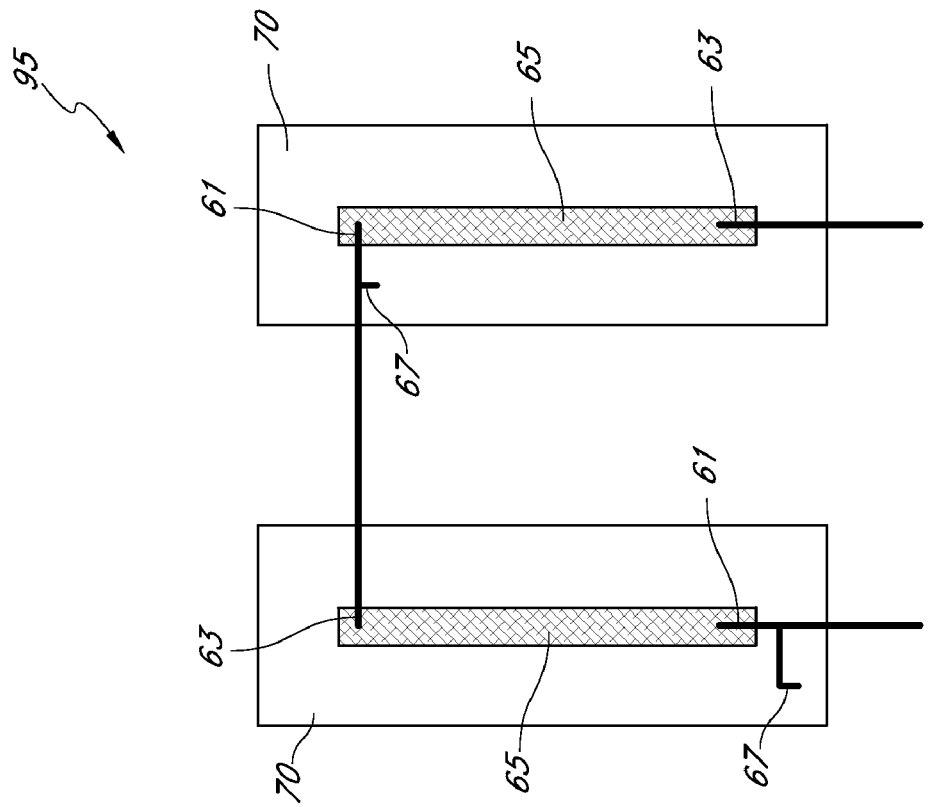
FIG. 4B is a top view of a layout of a divided p-diffused resistor in an n-well.
Figure 4A:
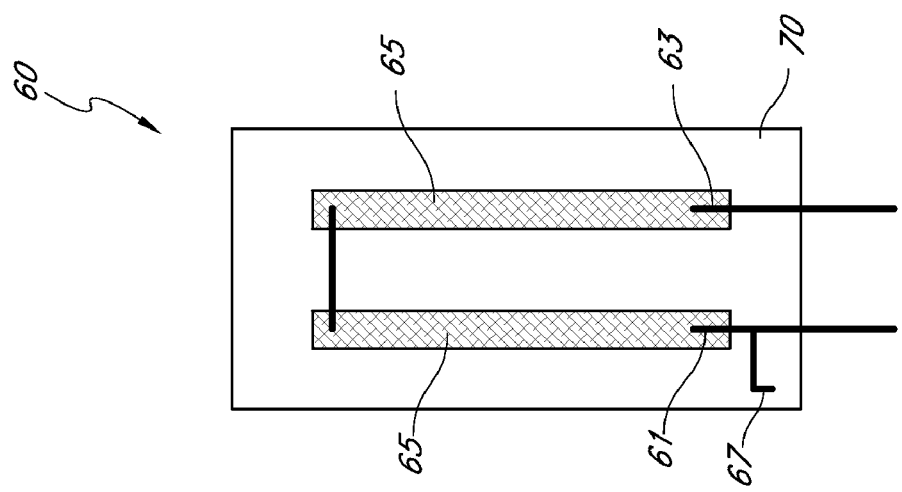
FIG. 4A is a top view of a layout of an undivided p-diffused resistor in an n-well.

A top view of an example of a diffused resistor 60 having a p-diffused layer 65 corresponding to an electrical resistance of 2R (e.g., R is 500 kΩ) in an undivided n-well 70 is shown in FIG. 4A. A divided diffused resistor 95 having the same electrical resistance 2R in two n-wells 70 is shown in FIG. 4B. The breakdown voltage is more readily handled by the divided diffused resistor 95 of FIG. 4B. However, the frequency response of a voltage divider utilizing these divided diffused resistors degrades according to the number of divided n-wells, as described below.

FIG. 3B shows an equivalent circuit for the p-diffused resistor 60. The equivalent circuit includes a resistor 62 representing the p-diffused layer between the first terminal 61 and the second terminal 63. A first capacitor 64 between the first terminal 61 and the well contact 67, along with a second capacitor 68 (having approximately the same capacitance as the first capacitor 64) between the second terminal 63 and well contact 67, represent the parasitic junction capacitance between the p-diffused layer and the n-well. A third capacitor 66 between the well contact 67 and ground 69 represents the parasitic junction capacitance between the n-well 70 and the P-type substrate 75. The parasitic capacitances 64, 66, and 68 may vary according to the device design, but in some embodiments can be less than about 0.2 picofarad (pF). In many instances, diffused resistors are arranged in series for higher breakdown voltage as illustrated in FIG. 3C.

FIG. 3C shows an equivalent circuit of the voltage divider 15 of FIG. 2, wherein the resistors 41A-41C have been implemented with resistors having the equivalent circuit shown in FIG. 3B for a divided diffused resistor with three n-wells. The output voltage $V_{OUT}$ 17 is connected to the first terminal (e.g., terminal 61, FIG. 3B) of the third resistor 41C. The first terminal (e.g., terminal 61, FIG. 3B) is electrically connected to the well contact (e.g., well contact 67, FIG. 3B) of the third resistor 41C. The second terminal (e.g., terminal 63, FIG. 3B) of the third resistor 41C is electrically connected to the first terminal 61 and the well contact 67 of the second resistor 41B. The second terminal 63 of the second resistor 41B is electrically connected to the first terminal 61 and the well contact 67 of the first resistor 41A and to an output terminal 24 corresponding to the monitored voltage $V_{MON}$ 19. Thus, the resistors 41A, 41B, and 41C are electrically connected in series between the output voltage $V_{OUT}$ 17 (at an input terminal) and a reference voltage (typically ground) (at a reference terminal). A node for an output terminal 24 is formed between first resistor 41A and second resistor 41B.

Figure 3D:
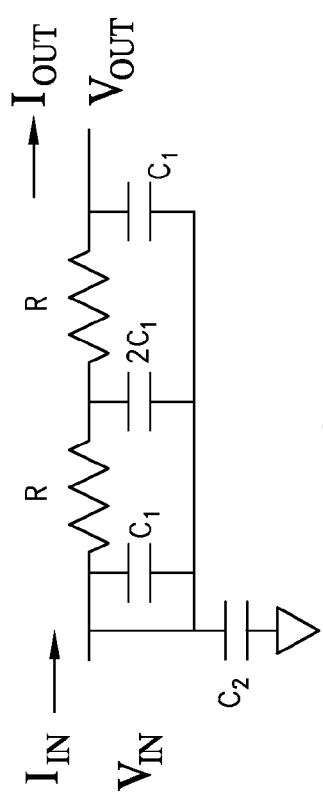
FIG. 3D illustrates an equivalent circuit diagram for a single pair of diffused resistors in series sharing a common well.

The frequency response of a pair diffused resistors in series sharing a common well as illustrated in FIG. 3D is described below. Analyzing the frequency response of a diffused resistor according to its equivalent circuit yields the transfer function A as expressed in Equation 2.

$$\left(\frac{I_{OUT}}{V_{OUT}}\right) = A\left(\frac{I_{IN}}{V_{IN}}\right) = \begin{pmatrix} \frac{1}{1+4sRC_1+2s^2(RC_1)^2} & \frac{-sC_2}{1+4sRC_1+2s^2(RC_1)^2} \\ \frac{-2R(1+sRC_1)}{1+4sRC_1+2s^2(RC_1)^2} & \frac{1+2sR(2C_1+C_2)+2s^2R^2C_1(C_1+C_2)}{1+4sRC_1+2s^2(RC_1)^2} \end{pmatrix}\left(\frac{I_{IN}}{V_{IN}}\right)$$

Eq. 2

In Equation 2, s is the complex frequency of the system, R is the electrical resistance of the diffused resistor 62, $C_1$ is the capacitance of the parasitic capacitors 64, 68, and $C_2$ is the capacitance of the parasitic capacitor 66. $V_{IN}$ and $I_{IN}$ correspond to the voltage and current at the first terminal 61, and $V_{OUT}$ and $I_{OUT}$ correspond to the voltage and current at the second terminal 63.

Figure 3E:
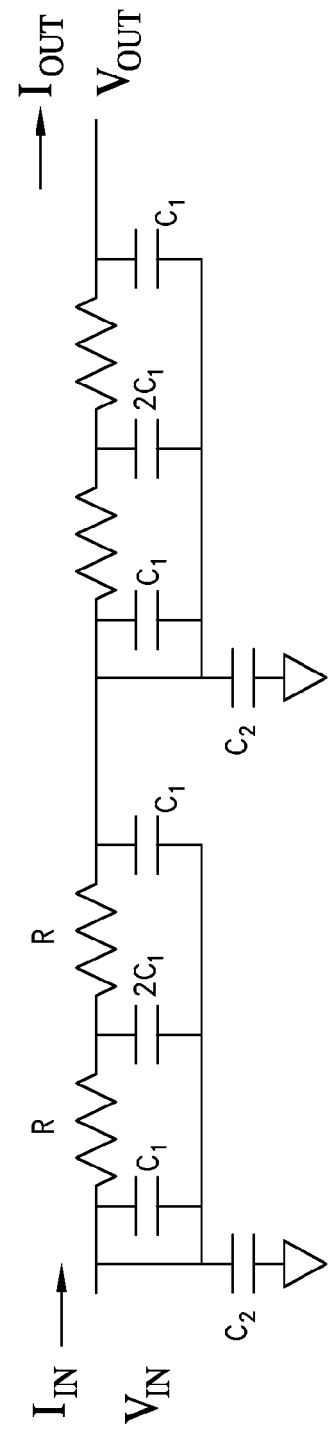
FIG. 3E illustrates an equivalent circuit diagram for two pairs of diffused resistors in series, wherein each pair shares a common well.

The pair of diffused resistors can be arranged in further n pairs in series. With each n pair, the resulting transfer function for n divisions corresponds to $A^n$. When n is equal to 1, Equation 2 applies (one pair of diffused resistors sharing the same well in series). As n is increased, the order of the transfer function is increased. For example, the transfer function $A^2$ (for 2 pairs of diffused resistors in series) is expressed in Equation 3. A corresponding diagram is illustrated in FIG. 3E.

$$A^2 = \begin{pmatrix} O(0)+O(2)/O(2) & O(1)+O(3)/O(2) \\ O(1)/O(2)+O(3)/O(4) & O(4)/O(4) \end{pmatrix}$$

Eq. 3

In Equation 3, O(x) corresponds to a polynomial of order x. As can be seen for each element of the transfer function, the denominator portion comprises a second or higher order polynomial. As the number of divisions n are increased, the transfer function $A^n$ corresponds to higher order polynomials.

As the order of the denominator portion of the transfer function increases, the number of poles may increase and the frequency response will typically degrade.

In contrast, n-well resistors and polysilicon resistors have less parasitic capacitance and typically do not have more than one pole when electrically connected in series. As a result, the performance of a voltage divider system utilizing n-well or polysilicon resistors tends to be substantially better than that of a system utilizing divided diffused resistors. In order to show this effect, the delay time between a change in the output voltage $V_{OUT}$ 17 and the corresponding change in the monitored voltage $V_{MON}$ 19 can be estimated for a voltage divider 15 utilizing n-well resistors, polysilicon resistors, or an undivided diffused resistor, and compared with the estimated delay time for a voltage divider 15 utilizing divided diffused resistors.

Figure 5B:
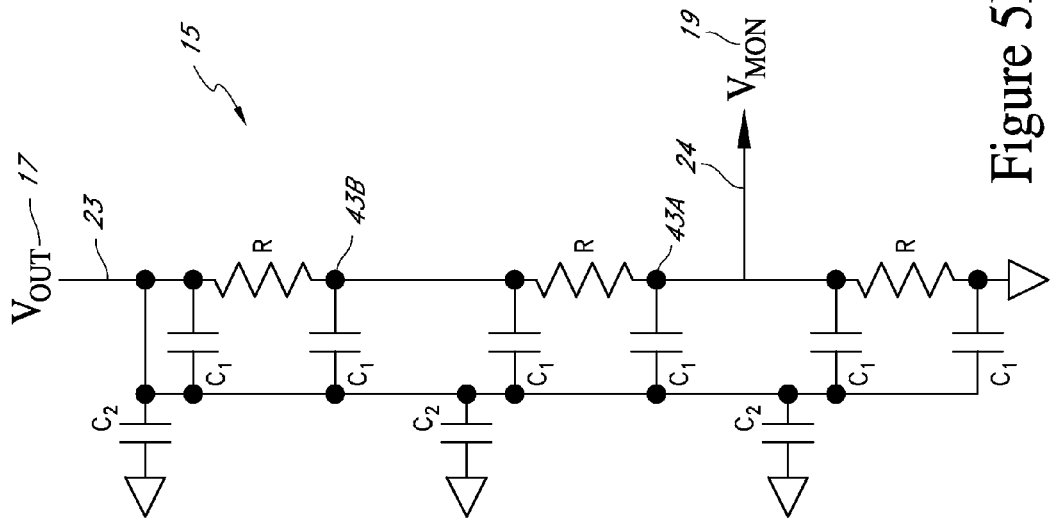
FIG. 5B is an equivalent circuit diagram of a voltage divider implemented with p-diffused resistors in an undivided n-well.
Figure 5A:
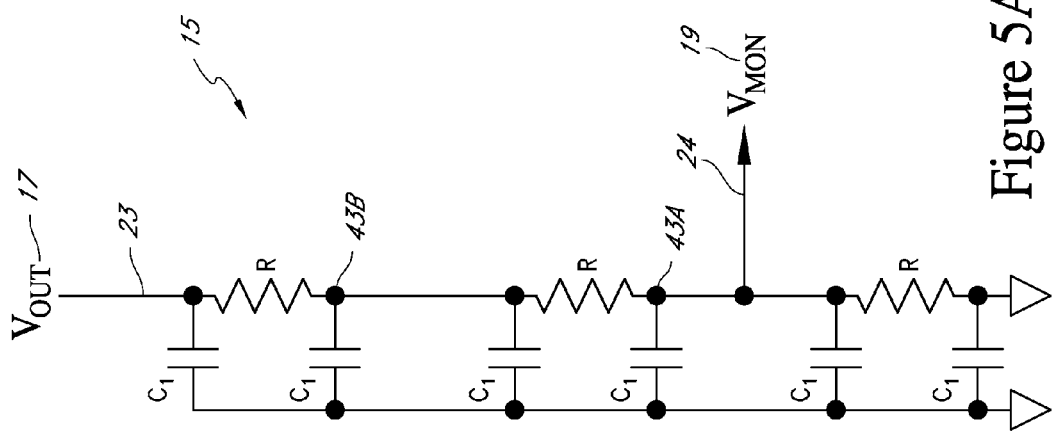
FIG. 5A is an equivalent circuit diagram of a voltage divider implemented with polysilicon or n-well resistors.

FIG. 5A shows the equivalent circuit for a voltage divider 15 implemented with either n-well or polysilicon resistors. Each of the three resistors also has two capacitors representing the parasitic capacitance between the n-well or polysilicon layer and the substrate. In some embodiments, the parasitic capacitance $C_1$ is less than about 0.2 pF. The total Elmore delay for such a system between the output voltage $V_{OUT}$ 17 and the monitored voltage $V_{MON}$ 19 is proportional to the sum of the Elmore delay at a first node 43A and the Elmore delay at a second node 43B. The Elmore delay at each terminal can be approximated by multiplying the resistance between the node and the input by the downstream capacitance. In the equivalent circuit, each resistor is modeled with a resistance of R. Then for the second node 43B the resistance is R. The parasitic capacitance for each capacitor is assumed to be $C_1$ and the downstream capacitance corresponds to the parasitic capacitance $C_1$ at the second terminal 63 of the first resistor in parallel with the parasitic capacitance $C_1$ at the first terminal 61 of the second resistor, or $2C_1$. Thus, the first node Elmore delay is $2RC_1$. The first node 43A has twice the resistance, but the same capacitance corresponding to the parasitic capacitance at the second terminal 63 of the second resistor and first terminal 61 of the third resistor, giving a delay of $4RC_1$. Thus, the total Elmore delay from the output voltage $V_{OUT}$ 17 to the monitored voltage $V_{MON}$ 19 is approximately $6RC_1$ for an n-well or polysilicon resistor voltage divider such as that shown in FIG. 5A.

A similar result is obtained for a voltage divider 15 implemented with undivided diffused resistors as shown in FIG. 5B. The parasitic capacitance between the well and the substrate is driven by the input and is typically not a significant component of the total delay. The delay therefore corresponds to the same Elmore delay approximation as described for n-well and polysilicon resistors, that is, $6RC_1$.

In contrast, the estimated Elmore delay for the voltage divider 15 shown in FIG. 3C utilizing three divided n-wells is typically substantially greater than for the n-well, polysilicon, and undivided diffused resistors as described above. At a second node 43B the estimated Elmore delay is the resistance between the input and the node, here R, multiplied by the downstream capacitance. The downstream capacitance corresponds to the parasitic capacitance between the diffused layer and the well at the second terminal 63 of the first diffused resistor in parallel with the parasitic capacitance between the well and substrate of the second diffused resistor. Thus, the Elmore delay at the first node is $R(C_1+C_2)$. At the second node, the resistance is doubled and the downstream capacitance corresponds to the parasitic capacitance of the third diffused resistor in parallel with the parasitic capacitance between the diffused layer and the well at the second terminal 63 of the second diffused resistor. Thus, the Elmore delay for the second node is $2R(3C_1+C_2)$. The total Elmore delay between the output voltage $V_{OUT}$ 17 and the monitored voltage $V_{MON}$ 19 for this system is $7RC_1+3RC_2$, which is substantially larger than for the n-well, polysilicon, or undivided diffused resistor cases.

Figure 6:
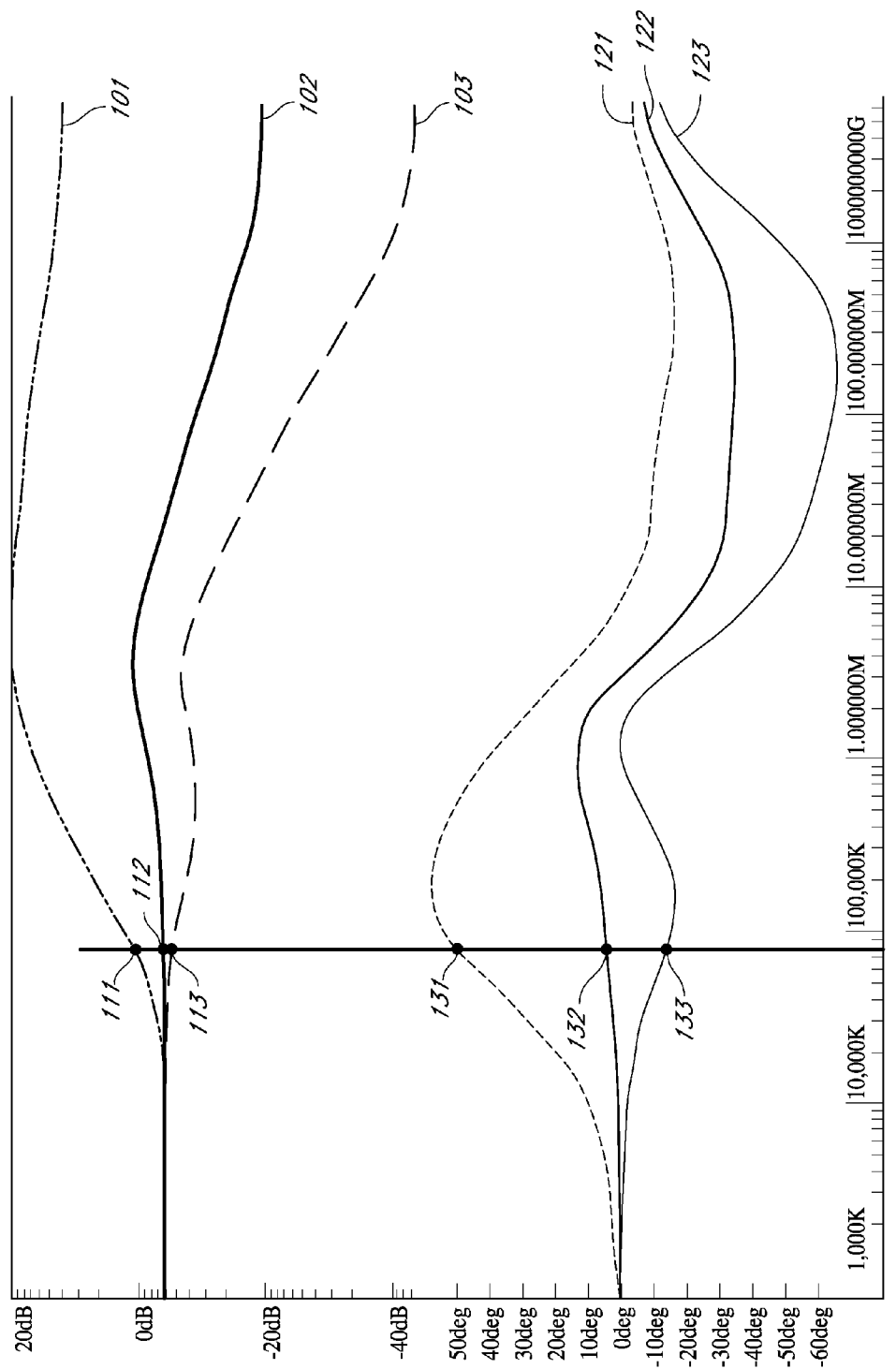
FIG. 6 is a Bode plot showing the voltage and phase shift of voltage dividers utilizing p-diffused resistors with varying numbers of divided n-wells.

FIG. 6 is a bode plot according to one embodiment showing a relationship between the number of divided n-wells and the frequency response of a voltage divider 15. A delay between the input and output of a voltage divider, as approximated above, may correspond to a degradation of the frequency response. When the delay causes the output signal to lag behind the input signal, a poor gain or magnitude of the output may be caused at certain frequencies because the output terminal is not charged while the input is high. The delay will also cause the output to follow the input, corresponding to a phase delay. The upper part of FIG. 6 shows the magnitude (vertical axis) of the monitored voltage $V_{MON}$ 19 as related to frequency (horizontal axis). The lower part of the Bode plot shown in FIG. 6 shows relationship between the phase (vertical axis) of the voltage divider response against the frequency (horizontal axis). Several voltage dividers are modeled with a varying number of divided resistors.

The Bode plot shows the magnitude plot 101 for a voltage divider with a single undivided n-well, the magnitude plot 102 for two divided n-wells, and the magnitude plot 103 for three divided n-wells. As can be seen, the poles created with multiple divided n-wells correspond to a degradation of the frequency response such that the voltage gain of the system is reduced and the phase response lags. Multiple poles represent a greater degradation of the frequency response. Thus, with multiple poles, the output voltage of the voltage divider, i.e., the monitored voltage $V_{MON}$ 19 (FIG. 2) does not respond to the driving voltage of the voltage divider, i.e., the output voltage $V_{OUT}$ 17 (FIG. 2), above certain frequencies. For example, at frequencies of about 75 kHz in the Bode plot shown, the magnitude of the voltage 113 corresponding to a diffused resistor having three divided n-wells is approximately six decibels less than the magnitude of the voltage 111 at the same frequency for a diffused resistor having no divisions. The voltage 113 is also about four decibels less than the voltage 112 for a diffused resistor with two divided n-wells. The system will therefore not be able to provide a relatively good response to changes in the input voltage.

The phase shift of the system is also shown in FIG. 6. As can be seen, when p-diffused resistors with divided n-wells are utilized, the frequency response becomes increasingly degraded with the number of divided n-wells, as represented by a negative phase shift. For example, at a frequency of about 75 kHz, the phase delay 131 of a voltage divider having a single undivided n-well is about 0°. The phase 132 of a voltage divider utilizing two divided n-wells lags by approximately −45° and the phase 133 for three divided n-wells lags by approximately 62°. The voltage divider may therefore have worse than desired performance, speed, and accuracy as the number of divided n-wells increases.

Figure 7:
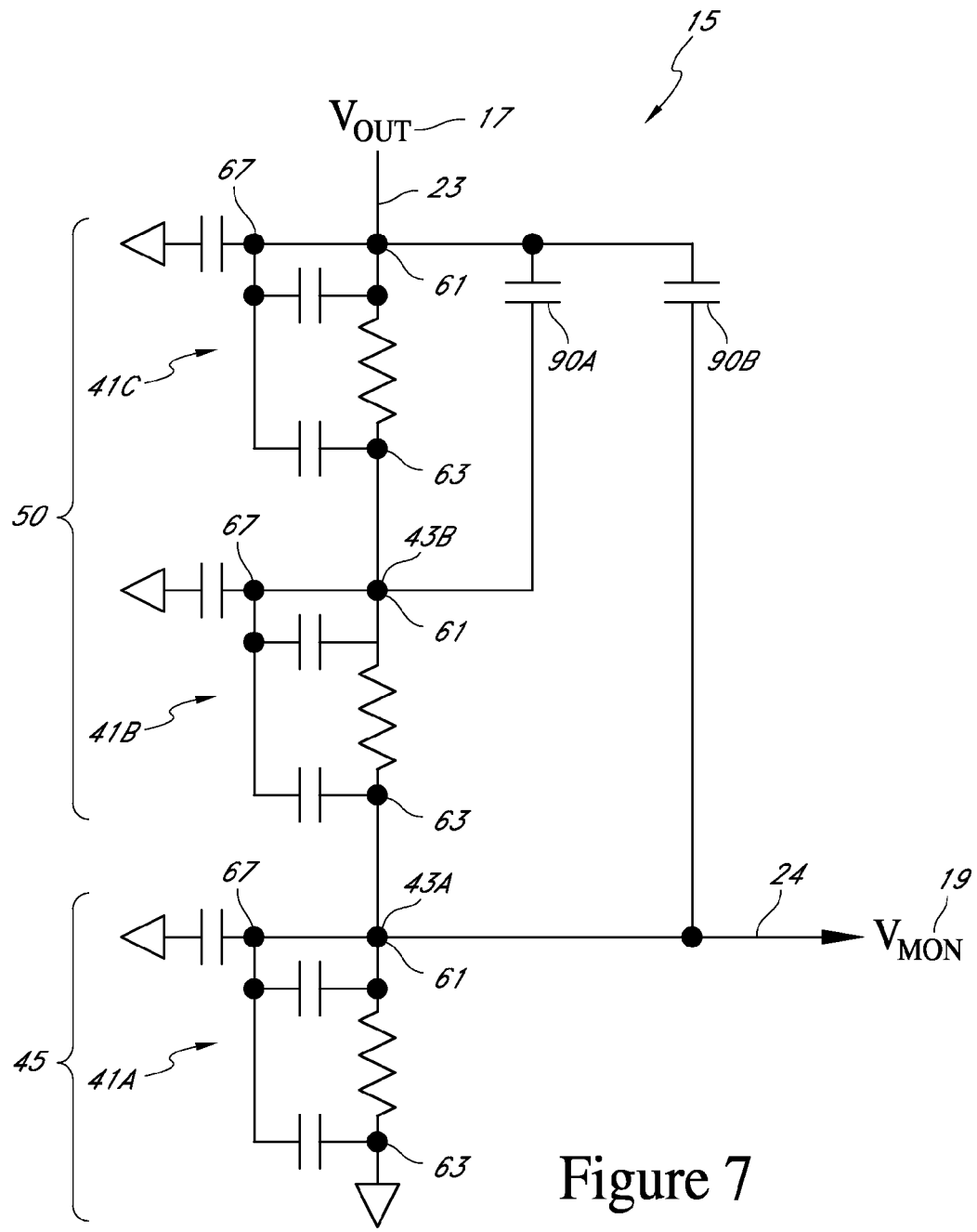
FIG. 7 is an equivalent circuit diagram of a voltage divider with a feed-forward capacitor network.

FIG. 7 shows an exemplary circuit diagram of a voltage divider 15 having feed-forward capacitors 90A and 90B, according to an embodiment of the current invention. In the illustrated embodiment, each diffused resistor 41A, 41B, and 41C has its own well. These diffused resistors include a first terminal 61 and a second terminal 63 for the diffused layer 65 of the resistor, and a well contact 67 for the well as described earlier in connection with FIG. 3A. Feed-forward capacitors are explicit capacitors, such as deliberately added capacitance, and are not merely parasitic capacitance that may be present. For example, the capacitors 90A and 90B may be metal-insulator-metal or metal-insulator-semiconductor capacitors. These capacitors can be formed for example by depositing a first electrode layer on a substrate, forming a dielectric layer over the first electrode layer, and forming a second electrode layer over the dielectric layer. In some embodiments, other types of capacitors may be used.

The illustrated voltage divider 15 includes three divided p-diffused resistors 41A-41C, each in its own n-well, and feed forward capacitors 90A, 90B. The resistive portion of the voltage divider 15 includes an upper leg 50 with resistors 41B, 41C, and a lower leg 45 with the resistor 41A. The output voltage $V_{OUT}$ 17 is connected to an input node 23 of the voltage divider 15, which includes the first terminal 61 of the resistor 41C, the well contact 67 for the well of the resistor 41C, and to feed-forward capacitors 90A, 90B as will be discussed. The feed-forward capacitor 90A is electrically connected across the input terminal 23 and a node 43B that includes a second terminal 63 of the resistor 41C, a first terminal 61 of the resistor 41B, and a well contact 67 for the well of the resistor 41B. The feed-forward capacitor 90B is electrically connected across the input terminal 23 and the node 43A that includes a first terminal 61 of the resistor 41A, a well contact 67 for the well of resistor 41A, and a second terminal 63 of resistor 41B. Thus, in one embodiment, the feed-forward capacitors 90A, 90B are each coupled to the input node 23 of the voltage divider 15 and to a node between each pair of the subsequent divided diffused resistors, e.g., the node 43B between diffused resistors 41B, 41A and the node 43A between diffused resistors 41A and 41B. This network configuration can be expanded in to handle any number of divided n-wells. In one embodiment, for each divided n-well, a feed-forward capacitor is connected between a node of the additional divided diffused resistor, wherein the node includes a terminal for the additional divided diffused resistor and a terminal for the respective n-well, and the voltage divider input terminal 23. The electrical capacitance of each capacitor 90A, 90B can vary according to the parasitic capacitance and the desired Elmore delay, but in some embodiments the capacitance may be between about 0.001 (pF) and 1.0 μF. For example, in one embodiment, the total value of the series resistance is between about 100 kΩ and 1 MΩ. If the controlled voltage in this case is approximately 20 V, the current is approximately 20 μA. In this embodiment, it is preferable that the feed-forward capacitors 90A, 90B be between about 1 pF and 10 pF. Other applicable values will be readily determined by one of ordinary skill in the art.

With the feed-forward capacitors 90A, 90B included in the voltage divider 15, the frequency response is improved as follows. Initially, the voltage divider 15 of FIG. 7 is at a steady state, and the feed-forward capacitor 90B is charged to the steady-state voltage that is present between node 23 and node 43A. At some point, the output voltage $V_{OUT}$ 17 is changed. For example, with an increase in the output voltage $V_{OUT}$ 17, current flows through feed-forward capacitor 90B and pulls up the monitored voltage $V_{MON}$ 19. This reduces the phase delay, as the monitored voltage $V_{MON}$ 19 rises relatively quickly with the output voltage $V_{OUT}$ 17. When the output voltage $V_{OUT}$ 17 drops from a steady state condition, feed-forward capacitor 90B draws current away from the output terminal and pulls down the monitored voltage $V_{MON}$ 19. Thus, when the output voltage $V_{OUT}$ 17 decreases, the monitored voltage $V_{MON}$ 19 decreases with less delay than would be experienced if the feed-forward capacitors 90A, 90B were not present. For additional diffused resistors, additional feed-forward capacitors can be connected to the additional diffused resistors and function in the same way to charge each of the nodes between the output voltage $V_{OUT}$ 17 and the monitored voltage $V_{MON}$ 19.

Figure 8:
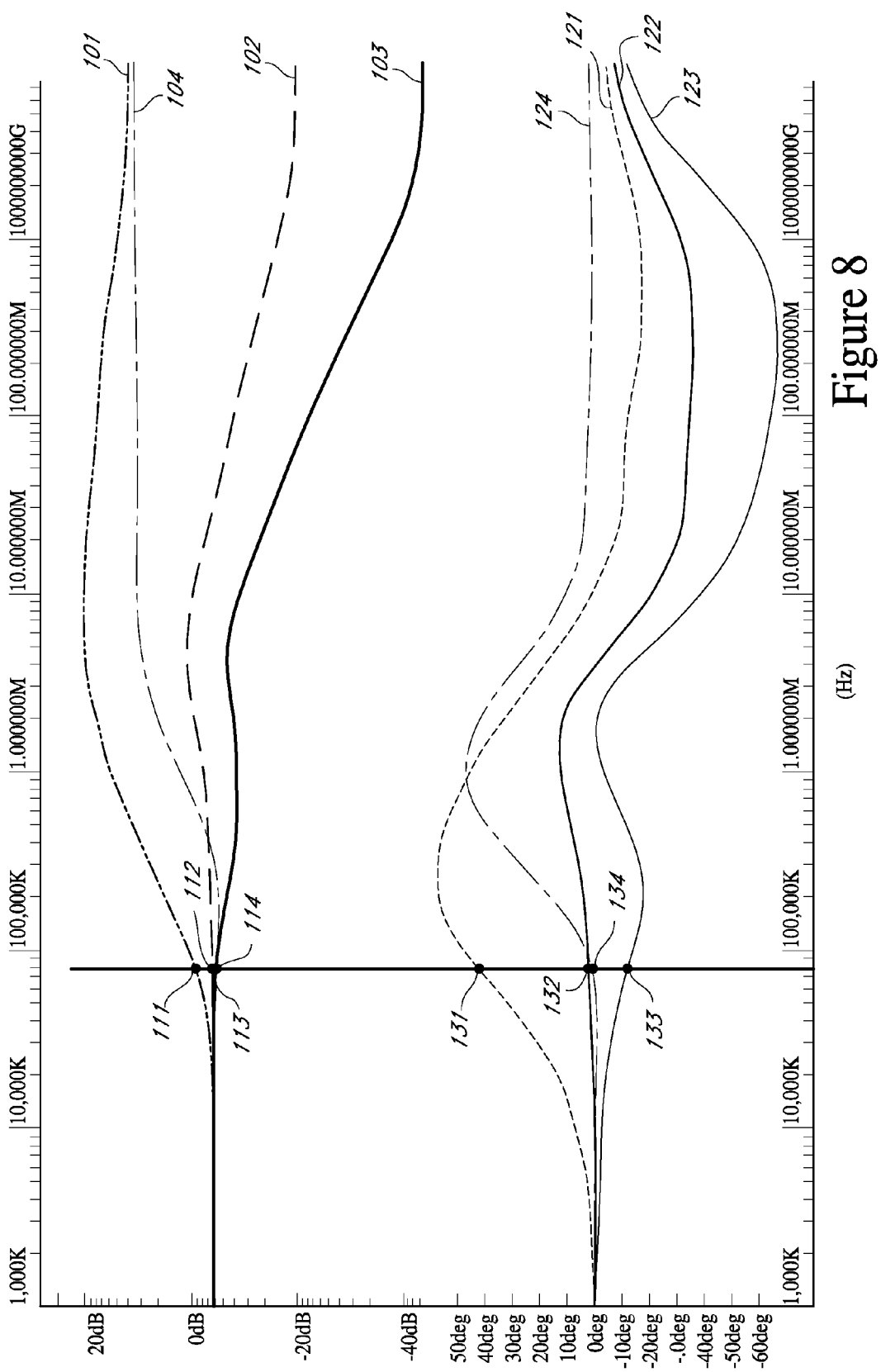
FIG. 8 is a Bode plot showing the voltage and phase shift of the voltage divider with the feed-forward capacitor network.

FIG. 8 is a Bode plot showing the frequency response of a voltage divider having a feed-forward capacitor network compared with the frequency response of voltage dividers having diffused resistors with varying numbers of divisions and no feed-forward capacitor network. FIG. 8 shows voltage plot 104 corresponding to the voltage response of a voltage divider having three divided n-wells and a feed-forward capacitor network. Plots 101, 102, and 103 from FIG. 6 are also reproduced in FIG. 8. As can be seen, the voltage gain does not decrease at high frequencies for a voltage divider with three divided n-wells when utilizing a feed-forward capacitor network as described herein. The voltage 104 approximates voltage 101 of the undivided system closely when compared with the divided cases without a feed-forward capacitor network. The phase shift 124 is also shown for a voltage divider with three divided n-wells and a feed-forward capacitor network. Utilizing three divided n-wells with the feed-forward capacitors 90A, 90B as diagrammed in FIG. 7, the phase delay 134 at 75 kHz and at higher frequencies is approximately 0°. The feed-forward capacitor network described thereby allows relatively good AC and DC performance of a diffused resistor voltage divider, without requiring additional process steps in the fabrication of the semiconductor device utilizing the voltage divider.

Figure 9A:
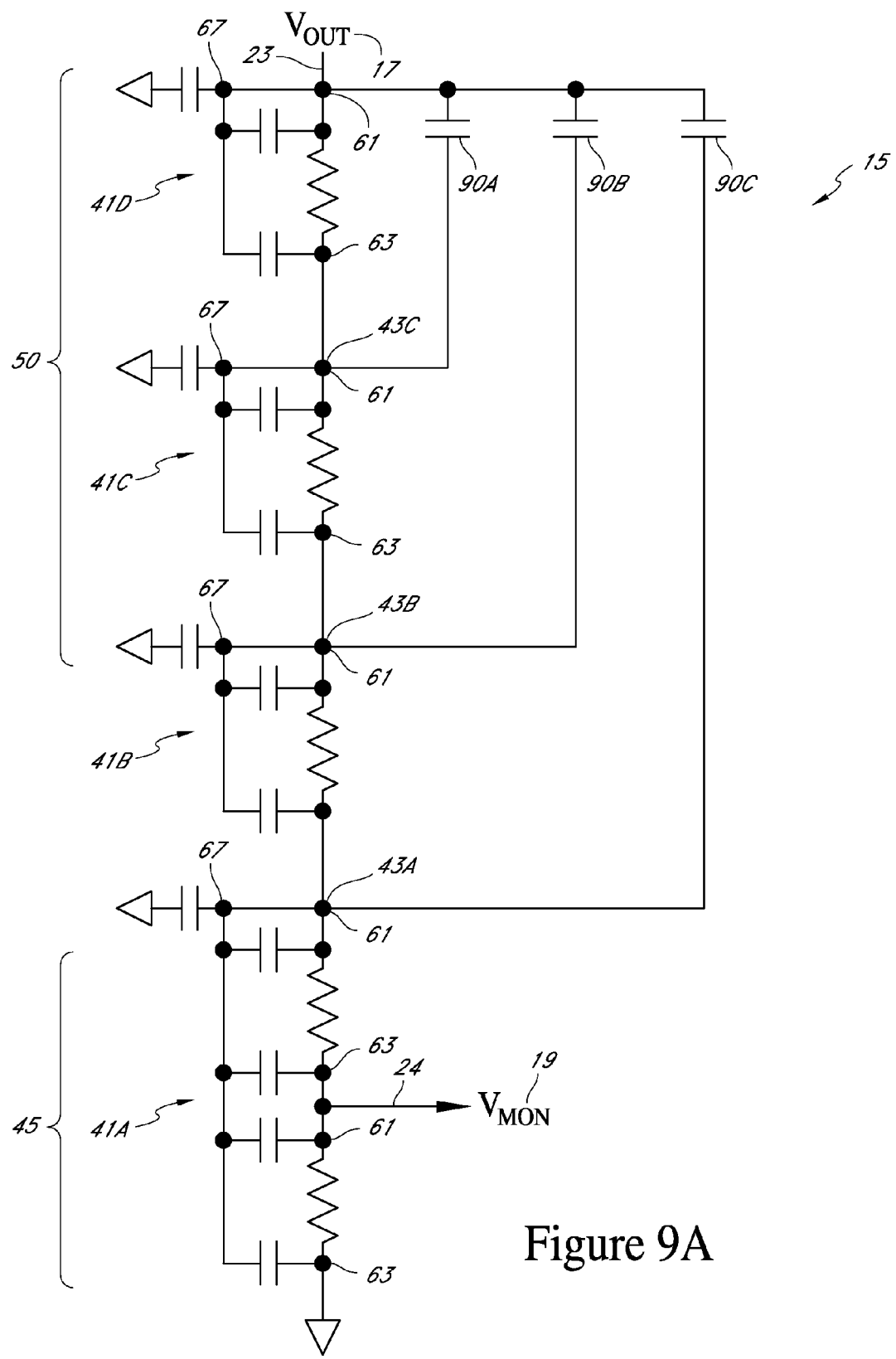
FIG. 9A is an equivalent circuit diagram of a voltage divider with four divided n-wells and a feed forward capacitor network.
Figure 9B:
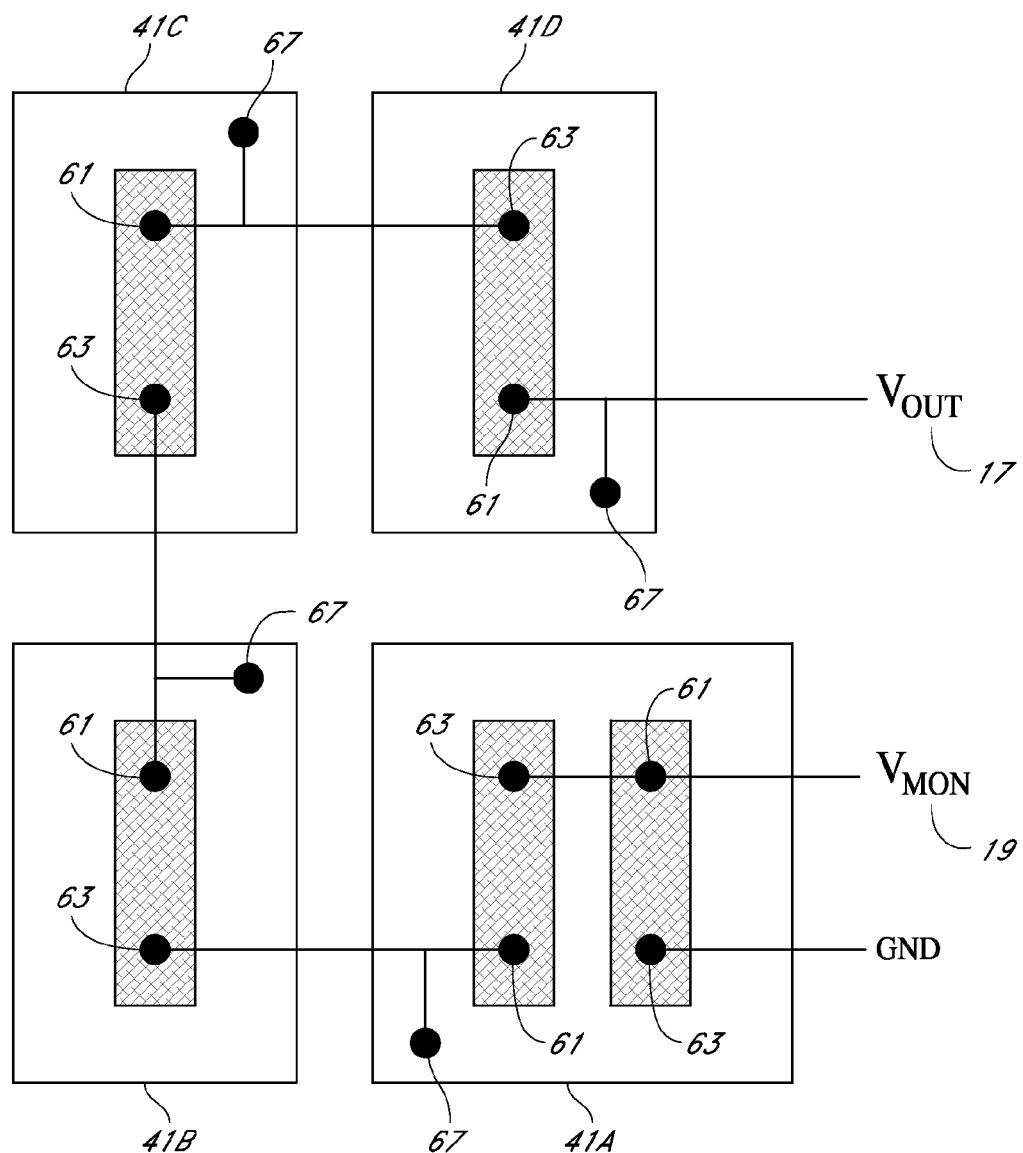
FIG. 9B is a top view of a layout of the resistors of the voltage divider of FIG. 9A with p-diffused resistors in four divided n-wells.

With reference to FIG. 9A, another embodiment of a feed-forward capacitor network for a voltage divider 15 is shown. FIG. 9A shows an embodiment of a voltage divider 15 with four divided n-wells. Related FIG. 9B illustrates a top view of an example of a layout for the resistors 41A, 41B, 41C, 41D of the voltage divider 15 of FIG. 9A. Layouts can vary widely and other layouts will be readily determined by one of ordinary skill in the art. In addition, the feed-forward capacitors 90A, 90B, 90C of the voltage divider 15 (FIG. 9A) are not drawn in the layout of FIG. 9B.

Returning now to FIG. 9A, each resistor 41B, 41C, 41D in an upper resistance leg 50 has its own well. These resistors 41B, 41C, 41D are coupled in series. In a lower resistance leg 45, two resistors 41A in series share a common well. An output terminal 24 for $V_{MON}$ 19 is coupled to a node between the two resistors 41A sharing a common well (as shown in more detail in FIG. 9B), i.e., the voltage tap for $V_{MON}$ 19 is at a point within the lower resistance leg 45.

In the illustrated embodiment, one terminal from each of the feed-forward capacitors 90A-90C is electrically connected to the input terminal 23 of the voltage divider 15, and the other terminal of each of the feed-forward capacitors 90A-90C is electrically connected to a first terminal 61 of a respective diffused resistor 41A-41C in a similar manner as described earlier in connection with FIG. 7. In the illustrated embodiment, each of the first terminals 61 of the diffused resistors 41A-41C are also coupled to a respective third terminal for the well of the diffused resistor 41A, 41B, 41C. For the four diffused resistors 41A-41D shown, feed-forward capacitors 90A, 90B, 90C are electrically connected across the input terminal 23 and the nodes 43C, 43B, 43A, respectively. The node 43C includes the second terminal 63 of the diffused resistor 41D, the first terminal 61 of the diffused resistor 41C, and the well contact 67 for the well of the diffused resistor 41C.

The node 43B includes the second terminal 63 of the diffused resistor 41C, the first terminal 61 of the diffused resistor 41B, and the well contact 67 for the well of the diffused resistor 41B. The node 43A includes the second terminal 63 of the diffused resistor 41B, the first terminal 61 of a resistor from the pair of resistors 41A, and a third terminal for the well for the pair of resistors 41A. A similar parallel type configuration can be achieved for any number of divided diffused resistors. As described above, the number of divisions used can be a function of the voltage level $V_{OUT}$ applied across the voltage divider and the breakdown voltage of the resistor. For example, if the breakdown voltage is 8V and the largest value of the output voltage $V_{OUT}$ 17 is approximately 24 V, then more than three divisions should be used.

FIG. 9B is a top view of an example of a layout for the resistors 41A, 41B, 41C, 41D of the voltage divider of FIG. 9A with p-diffused resistors in four divided n-wells. The capacitors 90A, 90B, 90C (FIG. 9A) are not shown in FIG. 9B. The resistors 41B, 41C, and 41D have one resistor per well. The pair of resistors 41A share a common well. The dividing of the resistors in more than one well can be used to increase the breakdown voltage across the resistors.

Figure 10A:
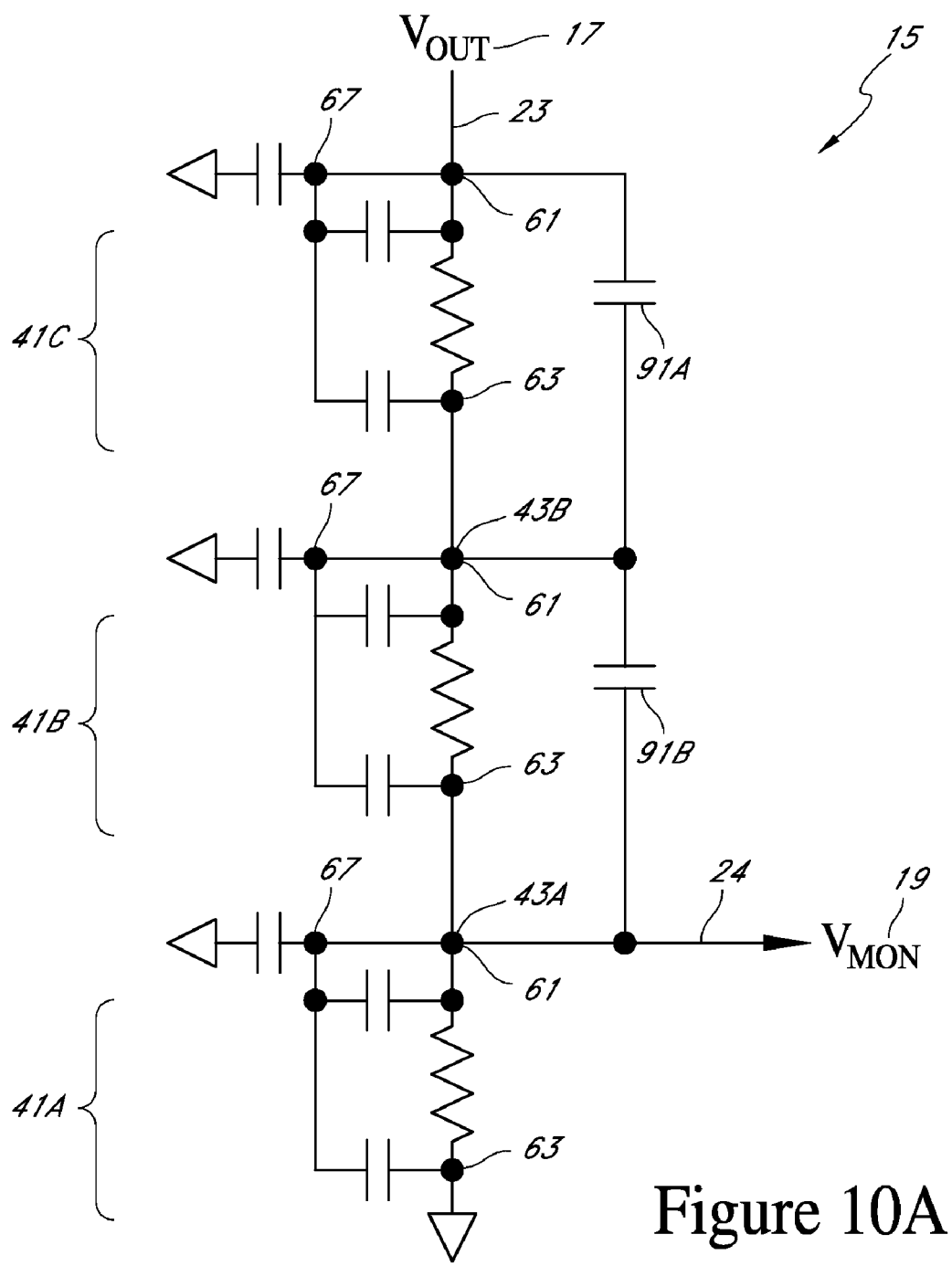
FIGS. 10A-10B are equivalent circuit diagrams of voltage resistors utilizing a series feed-forward capacitor network.
Figure 10B:
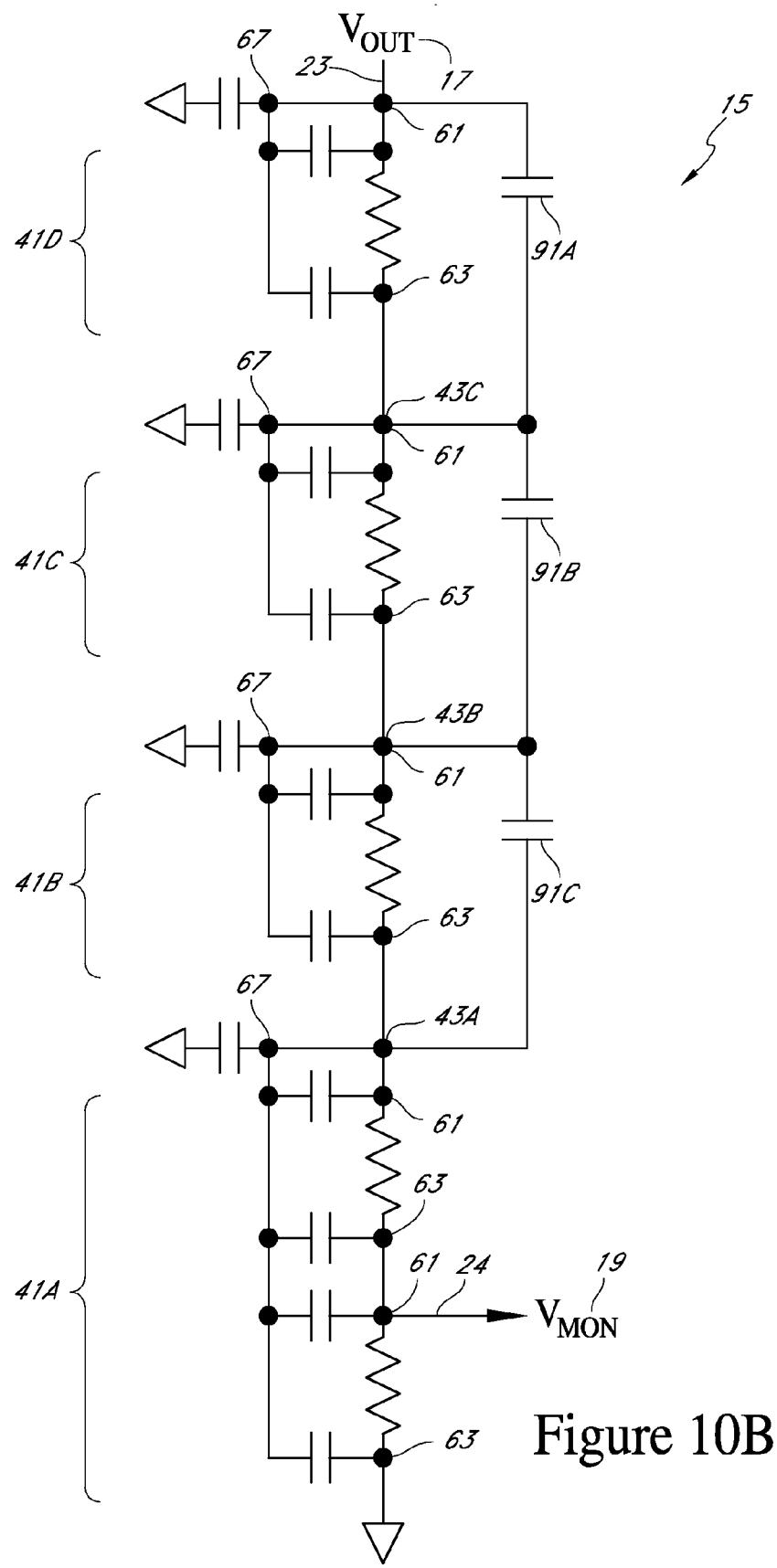

FIGS. 10A and 10B illustrate an alternative embodiment of a feed-forward capacitor network for a voltage divider 15. In the embodiment shown in FIGS. 10A and 10B, the feed-forward capacitors 91A-91C are connected in a series-type configuration from the input node 23 for $V_{OUT}$ 17 to the node 43A for $V_{MON}$ 19. As shown in FIG. 10A, the series arrangement is obtained by electrically coupling a first terminal of a feed-forward capacitor 91A to input terminal 23, and a second terminal of the feed-forward capacitor 91A to the node 43B. The node 43B includes the second terminal 63 of the diffused resistor 41C, the first terminal 61 of the diffused resistor 41B, and the well contact 67 for the well of the diffused resistor 41B. A second feed-forward capacitor 91B is coupled across the node 43B and the node 43A, which is coupled to the second terminal 63 of the diffused resistor 41B, to the first terminal 61 for the resistor 41A, and to the well contact 67 for the well of the diffused resistor 41A. The first terminal 61 of the diffused resistor 41A corresponds to the output terminal 24 of the voltage divider 15 for the monitored voltage $V_{MON}$ 19.

When the output voltage $V_{OUT}$ 17 applied to the voltage divider 15 has been at a steady state voltage, the capacitors 91A, 91B are charged to the voltage drop present across the respective diffused resistors 41C, 41B. When the output voltage $V_{OUT}$ 17 changes, current flows through the feed-forward capacitors 91A, 91B in a direction that charges or discharges each of the nodes depending on whether the output voltage $V_{OUT}$ 17 is rising or falling. This decreases the delay between a change in the output voltage $V_{OUT}$ 17 and observation of the change at the monitored voltage $V_{MON}$ 19.

FIG. 10B shows a series connection of feed-forward capacitors 91A-91C when the monitored voltage $V_{MON}$ 19 is connected between a second terminal 63 of a first resistor and a first terminal 61 of the second resistor of the pair of resistors a pair of diffused resistor 41A that share the same well. A node 24 includes the first terminal 61 and the second terminal 63 for the monitored voltage $V_{MON}$ 19. As with the parallel type configuration, the series-type configuration can be adapted with additional feed-forward capacitors for additional divisions with additional resistors. In FIG. 10B, four divided n-wells are shown corresponding to diffused resistors 41A-41D, and an additional feed-forward capacitor 91C is connected across the additional n-well (as compared with the embodiment shown in FIG. 10A). As described above, the number of divisions used can be a function of the input voltage and the breakdown voltage of the applicable resistors.

Figure 11:
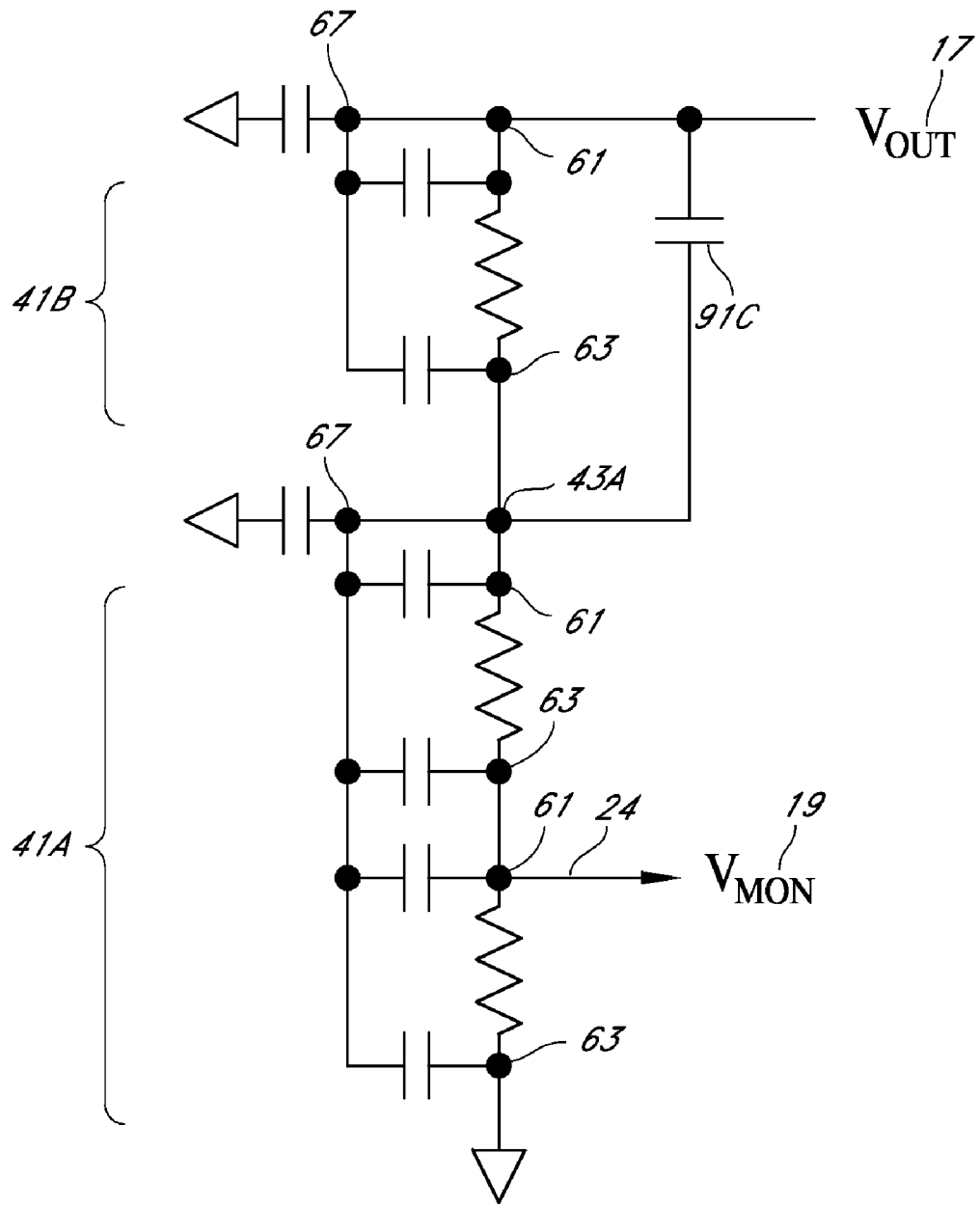
FIG. 11 is an equivalent circuit diagram of a voltage divider with a feed-forward capacitor, wherein an upper leg has a single resistor in a well, and a lower leg has two diffused resistors sharing another well.

FIG. 11 illustrates another embodiment of a voltage divider. The voltage divider includes two diffused resistors 41A sharing a common well, a third diffused resistor 41B, and an explicit feed-forward capacitor 91C in parallel across the first diffused resistor 41B. The divided voltage or monitored voltage $V_{MON}$ 19 is available at an output terminal 24 (output node for the voltage divider) and is coupled between the two diffused resistors 41A sharing the common well. A first terminal 61 of a first diffused resistor of the diffused resistors 41A is coupled to the monitored voltage $V_{MON}$ 19, and a second terminal 63 of the first diffused resistor is coupled to a voltage reference, typically ground.

A second diffused resistor of the diffused resistors 41A has a first terminal 61 and a second terminal 63. A first terminal 61 of the second diffused resistor is coupled to an electrical contact 67 for the corresponding well, to a second terminal 63 of the third diffused resistor 41B and to a second terminal of the capacitor 91C (node 43A). The second terminal 63 of the second diffused resistor is coupled to the first terminal 61 of the first diffused resistor and to the output terminal 24 for the monitored voltage $V_{MON}$ 19.

The third diffused resistor 41B has a first terminal 61 and a second terminal 63. The first terminal 61 is coupled to a contact 67 for the well of the third diffused resistor 41B, and to the input node for the voltage divider, which is typically the output voltage $V_{OUT}$ 17 of the charge pump 30 (FIG. 1), and to a first terminal of the feed-forward capacitor 91C. The second terminal 63 of the third diffused resistor 41B is coupled to a first terminal 61 of the second diffused resistor, and to a second terminal of the feed forward capacitor 91C (node 43A).

One embodiment includes an integrated circuit including: a plurality of 2 or more diffused resistors arranged in series for a voltage divider, the voltage divider including: an output node; an input node coupled to an input voltage; and a reference node coupled to a voltage reference; a first diffused resistor having a first terminal and a second terminal, wherein the first diffused resistor is of a first semiconductor type and is disposed in a first well of a second semiconductor type, wherein the first terminal is coupled to the output node and wherein the second terminal of the third diffused resistor is coupled to the reference node; one or more diffused resistors in series between the input node and the output node, the one or more diffused resistors including at least: a second diffused resistor having a first terminal and a second terminal, wherein the second diffused resistor is of the first semiconductor type and is disposed in a second well of the second semiconductor type, wherein the first terminal and the second well are coupled to the input node, wherein the second terminal is coupled directly or indirectly to the output node and to the first terminal of the first diffused resistor; at least one explicit capacitor having a first terminal and a second terminal, wherein the first terminal is coupled to the input node, and wherein the second terminal is coupled to another node such that the at least one explicit capacitor is in parallel with at least a portion of the one or more diffused resistors in series between the input node and the output node and is not in parallel with the first diffused resistor.

One embodiment includes a method of fabricating an integrated circuit, the method including: forming a plurality of 2 or more diffused resistors arranged in series for a voltage divider, further including: forming a first diffused resistor having a first terminal and a second terminal, wherein the first diffused resistor is of a first semiconductor type and is disposed in a first well of a second semiconductor type, wherein the first terminal is coupled to an output node and wherein the second terminal of the third diffused resistor is coupled to a reference node, wherein the reference node is coupled to a voltage reference; forming one or more diffused resistors in series between an input node and the output node, wherein the input node is coupled to an input voltage, further including: forming a second diffused resistor having a first terminal and a second terminal, wherein the second diffused resistor is of the first semiconductor type and is disposed in a second well of the second semiconductor type, wherein the first terminal and the second well are coupled to the input node, wherein the second terminal is coupled directly or indirectly to the output node and to the first terminal of the first diffused resistor; forming at least one explicit capacitor having a first terminal and a second terminal, wherein the first terminal is coupled to the input node, and wherein the second terminal is coupled to another node such that the at least one explicit capacitor is in parallel with at least a portion of the one or more diffused resistors in series and is not in parallel with the first diffused resistor.

Although certain embodiments of this invention have been disclosed herein, the invention extends beyond the specifically disclosed embodiments to other alternative embodiments and/or uses of the invention and modifications and equivalents thereof. In particular, a voltage divider and voltage regulator system has been described, certain advantages, features and aspects of the feed-forward capacitor system, device, and method may be realized in a variety of other applications and systems. Additionally, it is contemplated that various aspects and features of the invention described can be practiced separately, combined together, or substituted for one another, and that a variety of combination and subcombinations of the features and aspects can be made and still fall within the scope of certain embodiments of the invention. Furthermore, the systems described above need not include all of the components, modules, or functions described above. Thus, it is intended that the scope of the invention disclosed herein should not be limited by the disclosed embodiments described above.

I claim:

1. An integrated circuit comprising:
a first plurality of diffused resistors arranged in series for a voltage divider, the voltage divider comprising:
an output node; an input node coupled to an input voltage; and a reference node coupled to a voltage reference;
a first diffused resistor having a first terminal and a second terminal, wherein the first diffused resistor is of a first semiconductor type and is disposed in a first well of a second semiconductor type, wherein the first terminal is coupled to the output node and wherein the second terminal of the first diffused resistor is coupled to the reference node;
a second plurality of diffused resistors arranged in series between the input node and the output node, wherein each of the second plurality of diffused resistors is of the first semiconductor type and is disposed in its own well of the second semiconductor type, wherein the second plurality of diffused resistors consists of each resistor arranged in series between the input node and the output node; and
a plurality of explicit capacitors arranged in series, wherein each of the plurality of explicit capacitors is coupled directly in parallel with a respective one of each diffused resistor of the second plurality of diffused resistors;

wherein there is not an explicit capacitor in parallel with the first diffused resistor.

2. The integrated circuit of claim 1, wherein the first well for the first diffused resistor is coupled to the first terminal and to the output node.

3. The integrated circuit of claim 1, wherein the second plurality of diffused resistors comprises at least a second diffused resistor and a third diffused resistor, further comprising a fourth diffused resistor disposed in the first well, the fourth diffused resistor having a first terminal and a second terminal, wherein the first terminal is coupled to the first well and directly or indirectly to the second node of the second diffused resistor, and wherein the second terminal of the fourth diffused resistor is coupled to the output node and to the first terminal of the first diffused resistor.

4. The integrated circuit of claim 1, wherein the voltage reference coupled to the reference node is ground.

5. The integrated circuit of claim 1, wherein the resistors of the voltage divider have a total electrical resistance of between about 1 kΩ and 10 MΩ.

6. The integrated circuit of claim 1, wherein the resistors of the voltage divider have a total electrical resistance of between about 100 kΩ and 1 MΩ.

7. The integrated circuit of claim 1, wherein each of the plurality of capacitors has a capacitance of between about 0.1 picofarad (pF) and 1.0 microfarad (μF).

8. The integrated circuit of claim 1, wherein each of the plurality of capacitors has a capacitance of between about 1.0 pF and 10 μF.

9. The integrated circuit of claim 1, wherein the first type semiconductor comprises a p-type semiconductor, and the second type semiconductor comprises an n-type semiconductor.

10. The integrated circuit of claim 1, wherein the first type semiconductor comprises an n-type semiconductor, and the second type semiconductor comprises a p-type semiconductor.

11. An integrated circuit comprising:
a charge pump circuit;
a first plurality of diffused resistors arranged in series for a voltage divider, the voltage divider comprising:
an output node; an input node coupled to an input voltage; and a reference node coupled to a voltage reference;
a first diffused resistor having a first terminal and a second terminal, wherein the first diffused resistor is of a first semiconductor type and is disposed in a first well of a second semiconductor type, wherein the first terminal is coupled to the output node and wherein the second terminal of the first diffused resistor is coupled to the reference node;
a second plurality of diffused resistors arranged in series between the input node and the output node, wherein each of the second plurality of diffused resistors is of the first semiconductor type and is disposed in its own well of the second semiconductor type; and
a plurality of explicit capacitors arranged in series, wherein each of the plurality of explicit capacitors is coupled directly in parallel with a respective diffused resistor of at least a shunted portion of the second plurality of diffused resistors in series between the input node and the output node;
wherein there is not an explicit capacitor in parallel with the first diffused resistor;
wherein an output voltage of the charge pump circuit is coupled to the input node of the voltage divider as the input voltage, and wherein the output node of the voltage divider is coupled to a feedback control input of the charge pump circuit.

12. The integrated circuit of claim 11, wherein the second plurality of diffused resistors consists of each resistor arranged in series between the input node and the output node, wherein the shunted portion of the second plurality of diffused resistors comprises the entire second plurality of diffused resistors such that each capacitor of the plurality is coupled directly in parallel with a respective diffused resistor of the second plurality of diffused resistors.

13. The integrated circuit of claim 11, wherein the output voltage of the charge pump circuit is supplied to a memory.

14. The integrated circuit of claim 11, wherein the integrated circuit comprises a flash memory device.

15. A method of fabricating an integrated circuit, the method comprising:
forming a first plurality of diffused resistors arranged in series for a voltage divider, wherein forming the first plurality further comprises:
forming a first diffused resistor having a first terminal and a second terminal, wherein the first diffused resistor is of a first semiconductor type and is disposed in a first well of a second semiconductor type, wherein the first terminal is coupled to an output node and wherein the second terminal of the first diffused resistor is coupled to a reference node, wherein the reference node is coupled to a voltage reference;
forming a second plurality of diffused resistors arranged in series between an input node and the output node, wherein the input node is coupled to an input voltage, wherein each of the second plurality of diffused resistors is of the first semiconductor type and is disposed in its own well of the second semiconductor type, wherein the second plurality of diffused resistors consists of each resistor arranged in series between the input node and the output node;
forming a plurality of explicit capacitors arranged in series, wherein each of the plurality of explicit capacitors is coupled directly in parallel with a respective one of each diffused resistor of at least a shunted portion of the second plurality of diffused resistors between the input node and the output node; and
not forming an explicit capacitor in parallel with the first diffused resistor.

16. The method of claim 15, wherein the first type semiconductor comprises a p-type semiconductor, and the second type semiconductor comprises an n-type semiconductor.

17. The method of claim 15, wherein the first type semiconductor comprises an n-type semiconductor, and the second type semiconductor comprises a p-type semiconductor.

18. The method of claim 15, wherein the act of forming a well is performed at the same time that a bulk of one or more MOSFETs is formed.

19. The method of claim 15, wherein the act of forming the diffused resistors is performed at the same time that source and drain regions of one or more MOSFETs are formed.

* * * * *

UNITED STATES PATENT AND TRADEMARK OFFICE
CERTIFICATE OF CORRECTION

PATENT NO.        : 7,902,907 B2                                              Page 1 of 1
APPLICATION NO.   : 11/954763
DATED             : March 8, 2011
INVENTOR(S)       : Toru Tanzawa It is certified that error appears in the above-identified patent and that said Letters Patent is hereby corrected as shown below:

In column 14, line 45, in Claim 15, after "resistor" delete "of at least a shunted portion".

In column 14, lines 46-47, in Claim 15, after "resistors" delete "between the input node and the output node".

Signed and Sealed this
Twenty-seventh Day of March, 2012

David J. Kappos
*Director of the United States Patent and Trademark Office*